US009678148B2

(12) United States Patent
Rogel-Favila et al.

(10) Patent No.: US 9,678,148 B2
(45) Date of Patent: Jun. 13, 2017

(54) CUSTOMIZABLE TESTER HAVING TESTING MODULES FOR AUTOMATED TESTING OF DEVICES

(71) Applicant: Advantest Corporation, Tokyo (JP)

(72) Inventors: Ben Rogel-Favila, San Jose, CA (US); James Fishman, Santa Clara, CA (US)

(73) Assignee: ADVANTEST CORPORATION, Tokyo (JP)

(*) Notice: Subject to any disclaimer, the term of this patent is extended or adjusted under 35 U.S.C. 154(b) by 0 days.

(21) Appl. No.: 14/736,107

(22) Filed: Jun. 10, 2015

(65) Prior Publication Data
US 2015/0355271 A1    Dec. 10, 2015

Related U.S. Application Data

(63) Continuation-in-part of application No. 14/515,422, filed on Oct. 15, 2014, and a continuation-in-part of application No. 14/515,417, filed on Oct. 15, 2014, and a continuation-in-part of application No. 14/515,421, filed on Oct. 15, 2014.

(60) Provisional application No. 62/009,130, filed on Jun. 6, 2014, provisional application No. 62/009,130, filed on Jun. 6, 2014, provisional application No. 62/009,130, filed on Jun. 6, 2014, provisional application No. 62/011,538, filed on Jun. 12, 2014.

(51) Int. Cl.
G01R 31/01    (2006.01)
G01R 31/28    (2006.01)
G01R 1/04     (2006.01)

(52) U.S. Cl.
CPC ..... *G01R 31/2874* (2013.01); *G01R 31/2867* (2013.01); *G01R 1/04* (2013.01); *G01R 1/0458* (2013.01)

(58) Field of Classification Search
CPC ........ G01R 21/26; G01R 1/0458; G01R 1/04; G01R 31/2637; G01R 31/2801; G01R 31/2806; G01R 31/2808; G01R 31/281; G01R 31/2812; G01R 31/2834; G01R 31/2851; G01R 31/286; G01R 31/2863; G01R 31/2865; G01R 31/2867; G01R 31/2868; G01R 31/31905; G01R 31/31908
USPC ................ 324/73.1, 756.01, 756.02, 756.05, 324/757.01–757.05, 763, 750.22, 750.25, 324/750.26
See application file for complete search history.

(56) References Cited

U.S. PATENT DOCUMENTS 4,038,599 A    7/1977  Bove et al.
4,560,058 A    12/1985 Enochs et al.
4,724,383 A    2/1988  Hart
(Continued)

Primary Examiner — Patrick Assouad
Assistant Examiner — Sean Curtis

(57) ABSTRACT

In an embodiment, a testing system includes a frame, a DUT (device under test) testing module. The frame has at least one aperture extending from a front side of the frame to a rear side of the frame. The DUT testing module is inserted into the at least one aperture. The DUT testing module is operable to receive and hold a DUT receptacle including an electrical interface, an air flow interface, and a DUT coupled to the electrical interface. The DUT receptacle is configured to enclose and hold inside the DUT. Further, the DUT testing module is operable to couple to and to use the electrical interface and the air flow interface to perform a test at a controlled temperature on the DUT that is inside of the DUT receptacle.

20 Claims, 12 Drawing Sheets

(56) References Cited

U.S. PATENT DOCUMENTS

| | | | |
|---|---|---|---|
| 4,774,462 A | 9/1988 | Black | |
| 4,777,434 A | 10/1988 | Miller et al. | |
| 4,782,291 A * | 11/1988 | Blandin | G01R 31/2868 324/750.08 |
| 4,888,549 A | 12/1989 | Wilson et al. | |
| 5,310,039 A | 5/1994 | Butera et al. | |
| 5,329,227 A | 7/1994 | Sinclair | |
| 5,555,422 A | 9/1996 | Nakano | |
| 5,625,287 A | 4/1997 | Nakamura et al. | |
| 5,633,598 A | 5/1997 | Van Loan et al. | |
| 5,788,084 A * | 8/1998 | Onishi | G01R 31/04 209/573 |
| 5,794,783 A | 8/1998 | Carter | |
| 5,847,293 A | 12/1998 | Jones | |
| 5,945,838 A | 8/1999 | Gallagher et al. | |
| 6,008,636 A | 12/1999 | Miller et al. | |
| 6,078,188 A * | 6/2000 | Bannai | G01R 31/01 209/573 |
| 6,137,303 A | 10/2000 | Deckert et al. | |
| 6,194,908 B1 | 2/2001 | Wheel et al. | |
| 6,198,273 B1 * | 3/2001 | Onishi | G01R 31/01 324/750.01 |
| 6,204,679 B1 | 3/2001 | Gray, III | |
| 6,339,321 B1 | 1/2002 | Yamashita et al. | |
| 6,354,792 B1 | 3/2002 | Kobayashi et al. | |
| 6,392,433 B2 | 5/2002 | Itasaka et al. | |
| 6,518,745 B2 * | 2/2003 | Kim | G01R 31/01 324/750.13 |
| 6,526,841 B1 * | 3/2003 | Wanek | G01R 31/2849 324/750.08 |
| 6,583,638 B2 * | 6/2003 | Costello | H01L 21/67109 324/750.09 |
| 6,679,128 B2 * | 1/2004 | Wanek | G01R 31/2849 73/865.6 |
| 6,732,053 B1 | 5/2004 | Aragona | |
| 7,070,323 B2 * | 7/2006 | Wanek | G01R 31/2849 324/750.08 |
| 7,091,737 B2 * | 8/2006 | Norris | G01R 31/2868 324/750.05 |
| 7,151,388 B2 | 12/2006 | Gopal et al. | |
| 7,292,023 B2 | 11/2007 | Dangelo et al. | |
| 7,339,387 B2 | 3/2008 | Dangelo et al. | |
| 7,532,023 B2 | 5/2009 | Norris | |
| 7,550,964 B2 | 6/2009 | Dangelo et al. | |
| 7,612,575 B2 * | 11/2009 | Ito | G01R 31/31718 324/750.3 |
| 7,800,393 B2 * | 9/2010 | Ito | G01R 31/31718 324/754.08 |
| 7,825,650 B2 * | 11/2010 | Casterton | G01R 31/2893 324/750.3 |
| 7,884,631 B2 * | 2/2011 | Co | G11C 29/56 324/757.01 |
| 7,929,303 B1 | 4/2011 | Merrow | G11B 33/128 324/73.1 |
| 7,960,992 B2 * | 6/2011 | Co | G11C 29/56 324/757.01 |
| 8,237,461 B2 | 8/2012 | Kitazume et al. | |
| 8,248,091 B2 | 8/2012 | Cheng et al. | |
| 8,269,507 B2 | 9/2012 | Hall | |
| 9,110,129 B1 * | 8/2015 | Ames | G01R 31/2808 |
| 2001/0035058 A1 * | 11/2001 | Wanek | G01R 31/2849 73/865.6 |
| 2002/0011862 A1 * | 1/2002 | Kvanvig | G01R 31/2875 324/750.09 |
| 2002/0053045 A1 | 5/2002 | Gillenwater et al. | |
| 2002/0109518 A1 | 8/2002 | Saito et al. | |
| 2002/0130654 A1 * | 9/2002 | Tauchi | G01R 31/2851 324/750.16 |
| 2002/0149389 A1 | 10/2002 | Bjork | |
| 2002/0175697 A1 * | 11/2002 | Miller | G01R 31/3193 324/762.01 |
| 2003/0085160 A1 | 5/2003 | Shim et al. | |
| 2003/0121337 A1 * | 7/2003 | Wanek | G01R 31/2849 73/865.6 |
| 2003/0173950 A1 | 9/2003 | Flach et al. | |
| 2004/0062104 A1 | 4/2004 | Muller et al. | |
| 2004/0066207 A1 * | 4/2004 | Bottoms | G01R 31/2886 324/756.02 |
| 2004/0178808 A1 * | 9/2004 | Fenk | G01R 31/2862 324/703 |
| 2006/0066293 A1 | 3/2006 | Gopal et al. | |
| 2007/0063724 A1 | 3/2007 | Roberts et al. | |
| 2008/0038098 A1 | 2/2008 | Ito et al. | |
| 2008/0042667 A1 | 2/2008 | Yamashita et al. | |
| 2008/0079456 A1 * | 4/2008 | Lee | G01R 31/2893 324/750.03 |
| 2008/0136439 A1 * | 6/2008 | Adam | G01R 31/2889 324/750.08 |
| 2008/0143129 A1 | 6/2008 | Wong et al. | |
| 2009/0195264 A1 | 8/2009 | Tsen et al. | |
| 2009/0217093 A1 | 8/2009 | Co | |
| 2011/0012631 A1 * | 1/2011 | Merrow | G11B 33/128 324/750.03 |
| 2011/0012632 A1 * | 1/2011 | Merrow | G11B 5/4555 324/750.03 |
| 2011/0074458 A1 | 3/2011 | Di Stefano et al. | |
| 2012/0068725 A1 | 3/2012 | Pagani | |
| 2012/0139572 A1 | 6/2012 | Kim | |
| 2012/0249177 A1 | 10/2012 | Choi et al. | |
| 2012/0291999 A1 * | 11/2012 | Lewinnek | G01R 31/2877 165/104.31 |
| 2013/0057310 A1 | 3/2013 | Hasegawa et al. | |
| 2013/0200913 A1 | 8/2013 | Panagas | |
| 2013/0200916 A1 * | 8/2013 | Panagas | G01R 1/0441 324/757.01 |
| 2014/0015559 A1 * | 1/2014 | Lee | G01R 1/0466 324/756.02 |
| 2014/0184255 A1 * | 7/2014 | Johnson | G01R 31/2834 324/750.16 |
| 2014/0218063 A1 * | 8/2014 | Roberts, Jr. | G01R 31/2601 324/756.02 |
| 2014/0306728 A1 * | 10/2014 | Arena | G01R 31/2808 324/750.08 |
| 2015/0028908 A1 * | 1/2015 | Kushnick | G06F 11/2221 324/750.05 |
| 2015/0061713 A1 | 3/2015 | Shia et al. | |
| 2015/0233967 A1 * | 8/2015 | Thordarson | G11C 29/56016 324/750.14 |
| 2015/0234006 A1 | 8/2015 | Richards et al. | |
| 2015/0355229 A1 | 12/2015 | Rogel-Favila et al. | |
| 2015/0355230 A1 | 12/2015 | Rogel-Favila et al. | |
| 2015/0355231 A1 * | 12/2015 | Rogel-Favila | G01R 31/26 324/750.13 |
| 2015/0355268 A1 * | 12/2015 | Rogel-Favila | G01R 31/2893 324/750.08 |
| 2015/0355270 A1 * | 12/2015 | Rogel-Favila | G01R 31/2874 324/750.08 |
| 2015/0355271 A1 * | 12/2015 | Rogel-Favila | G01R 31/2874 324/750.08 |
| 2015/0355279 A1 * | 12/2015 | Rogel-Favila | G01R 31/2893 324/750.25 |

\* cited by examiner

CUSTOMIZABLE TESTER HAVING TESTING MODULES FOR AUTOMATED TESTING OF DEVICES

CROSS-REFERENCE TO RELATED APPLICATIONS

This application is a Continuation-In-Part of and claims priority to U.S. patent application Ser. No. 14/515,422, filed on Oct. 15, 2014, which claims the benefit of and priority to U.S. Provisional Application No. 62/009,130, filed on Jun. 6, 2014, which are hereby incorporated by reference in their entirety. This application is a Continuation-In-Part of and claims priority to U.S. patent application Ser. No. 14/515,417, filed on Oct. 15, 2014, which claims the benefit of and priority to U.S. Provisional Application No. 62/009,130, filed on Jun. 6, 2014, which are hereby incorporated by reference in their entirety. This application is a Continuation-In-Part of and claims priority to U.S. patent application Ser. No. 14/515,421, filed on Oct. 15, 2014, which claims the benefit of and priority to U.S. Provisional Application No. 62/009,130, filed on Jun. 6, 2014, which are hereby incorporated by reference in their entirety.

This application claims the benefit of and priority to U.S. Provisional Application No. 62/011,538, filed on Jun. 12, 2014, which is hereby incorporated by reference in its entirety.

This application is related to U.S. patent application Ser. No. 14/736,070, U.S. patent application Ser. No. 14/736,139, and U.S. patent application Ser. No. 14/736,166, which are hereby incorporated by reference in their entirety.

FIELD

Embodiments relate to testing of devices. More specifically, embodiments relate to automated testing of devices

BACKGROUND

Bringing a product to market generally entails a design stage, a manufacturing stage, and a testing stage. Given the competition of the marketplace, it makes sense not to de-prioritize anyone of these stages. For example, decisions made during the design stage influence whether the product will be manufacturable and/or will be testable. Also, the testing stage offers the opportunity to detect design flaws and to uncover manufacturing defects.

Typically, the testing stage is crafted as a product-centric solution or as an equipment-centric solution. In the product-centric solution, the testing set-up is focused and optimized for testing a specific product. If a different product is to be tested, another testing set-up is developed for the different product. In the case of the equipment-centric solution, specific testing equipment forms the foundation of the testing set-up. Measures are taken to deal with the limitations of the specific testing equipment in implementing the testing set-up.

SUMMARY

A new paradigm for automated device testing is presented. Instead of focusing on testing numerous of the same devices in the same testing environment (e.g., under the same temperature conditions) with the same test, the focus shifts to establishing an individualized automated testing environment for the device under the new paradigm. Due to the individualized automated testing environment, barriers such as the type of device under test (DUT) that may be tested, the type of test that may be performed, and the test conditions that may be furnished are overcome. Consequently, different DUT types, different test types, and different test conditions are possible on a test floor under the new paradigm. DUT receptacles, DUT testing modules, testers, test floor equipment, and automated control implement the new paradigm for automated device testing.

Herein, the discussion will focus on the testers.

In an embodiment, a testing system includes a frame, a DUT (device under test) testing module. The frame has at least one aperture extending from a front side of the frame to a rear side of the frame. The DUT testing module is inserted into the at least one aperture. The DUT testing module is operable to receive and hold a DUT receptacle including an electrical interface, an air flow interface, and a DUT coupled to the electrical interface. The DUT receptacle is configured to enclose and hold inside the DUT. Further, the DUT testing module is operable to couple to and to use the electrical interface and the air flow interface to perform a test at a controlled temperature on the DUT that is inside of the DUT receptacle.

In another embodiment, a testing system is described comprising: a frame including a plurality of apertures, wherein the apertures extend from a front side of the frame to a rear side of the frame; a first DUT (device under test) testing module inserted into a first aperture of the plurality of apertures, wherein the first DUT testing module is operable to receive and hold a first DUT receptacle including a first electrical interface, a first air flow interface, and a first DUT coupled to the first electrical interface, wherein the first DUT receptacle is operable to enclose and hold inside the first DUT, wherein the first DUT testing module is operable to couple to and to use the first electrical interface and the first air flow interface to perform a first type of test at a first controlled temperature on the first DUT that is inside of the first DUT receptacle; and a second DUT testing module inserted into a second aperture of the plurality of apertures, wherein the second DUT testing module is operable to receive and hold a second DUT receptacle including a second electrical interface, a second air flow interface, and a second DUT coupled to the second electrical interface, wherein the second DUT receptacle is operable to enclose and hold inside the second DUT, wherein the second DUT testing module is operable to couple to and to use the second electrical interface and the second air flow interface to perform a second type of test at a second controlled temperature on the second DUT that is inside of the second DUT receptacle, wherein size, shape, first electrical interface, and first air flow interface of the first DUT receptacle is uniform with size, shape, second electrical interface, and second air flow interface of the second DUT receptacle.

In yet another embodiment, a method is disclosed comprising: coupling a DUT (device under test) receptacle to a first DUT testing module, wherein the first DUT testing module is located in a first aperture of a frame of a tester, wherein the first aperture extends from a front side of the frame to a rear side of the frame, wherein the DUT receptacle includes an electrical interface, an air flow interface, and a DUT coupled to the electrical interface, and wherein the DUT receptacle is operable to enclose and hold inside the DUT; performing a first type of test at a first controlled temperature on the DUT that is inside of the DUT receptacle by using the first DUT testing module, wherein the first DUT testing module is operable to couple to and to use the electrical interface and the air flow interface to perform the first type of test; after the first type of test is performed, coupling the DUT receptacle to a second DUT testing module, wherein the second DUT testing module is located in a second aperture of the frame of the tester, wherein the second aperture extends from the front side of the frame to the rear side of the frame; and performing a second type of test at a second controlled temperature on the DUT that is inside of the DUT receptacle by using the second DUT testing module, wherein the second DUT testing module is operable to couple to and to use the electrical interface and the air flow interface to perform the second type of test.

BRIEF DESCRIPTION OF THE DRAWINGS

The accompanying drawings, which are incorporated in and form a part of this specification, illustrate embodiments, together with the description, serve to explain the principles of the disclosure.

DETAILED DESCRIPTION

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

The individualized automated testing environment offers a wide range of flexibility. As will be explained in detail, on the device-side, a DUT (device under test) receptacle offers a uniform size and shape and a uniform physical/air/electrical interface irrespective of the size, the shape, and type of the device under test (DUT). On the testing-side, the DUT testing modules, testers, test floor equipment, and automated control are designed to interact with the uniform size and shape and the uniform physical/air/electrical interface provided by the DUT receptacle. Detailed disclosure of the testers is provided herein. While the DUT receptacle is described in FIGS. 7-9, detailed disclosure of the DUT receptacle is found in the applications incorporated by reference herein. While the DUT testing module is described in FIGS. 10-12, detailed disclosure of the DUT testing module is found in the applications incorporated by reference herein. Further, detailed disclosure of test floor equipment and automated control is found in the applications incorporated by reference herein.

DUT Receptacle

Figure 7:
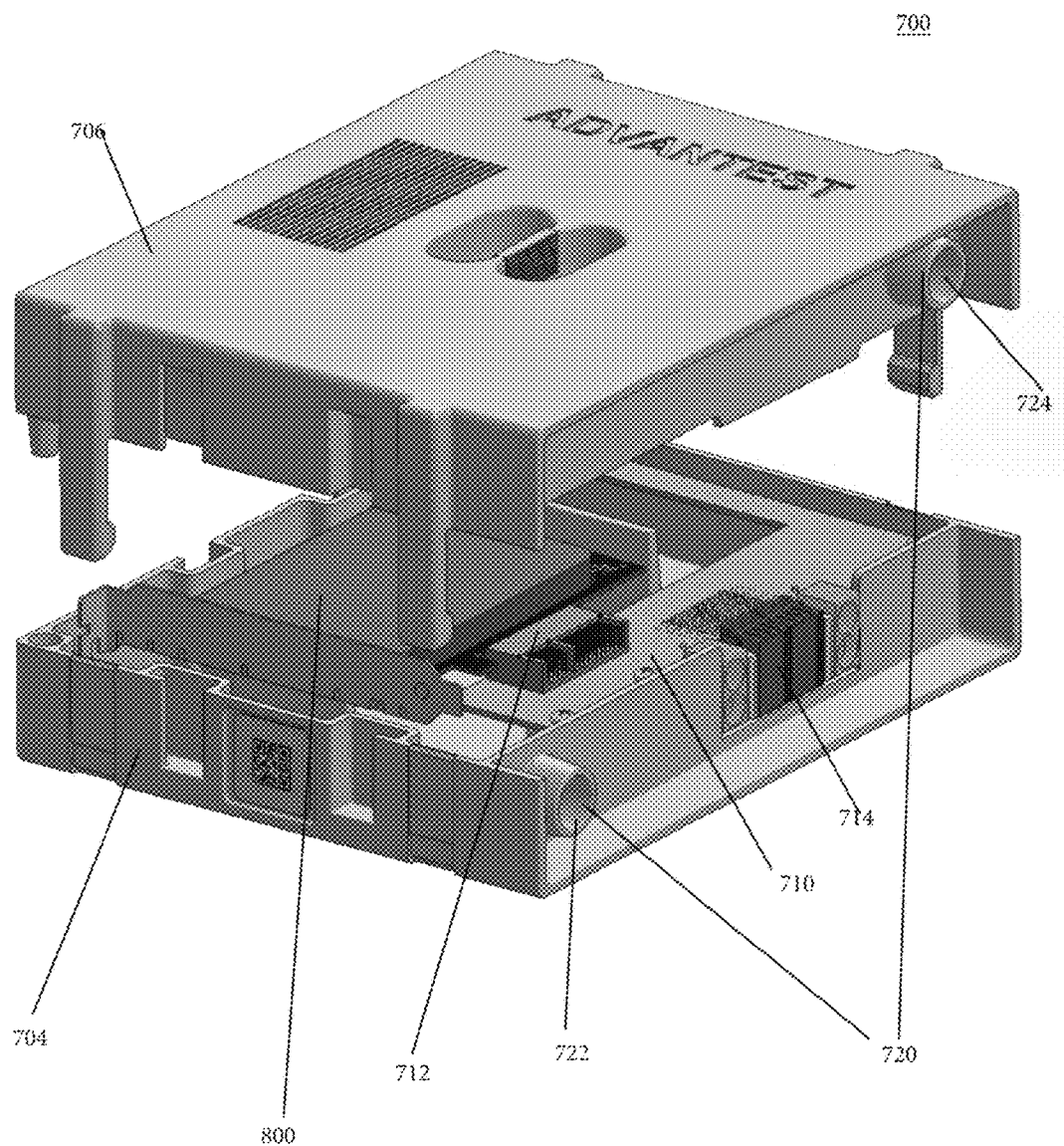
FIG. 7 illustrates an exploded view of a DUT receptacle in accordance with an embodiment, showing a DUT.
Figure 8:
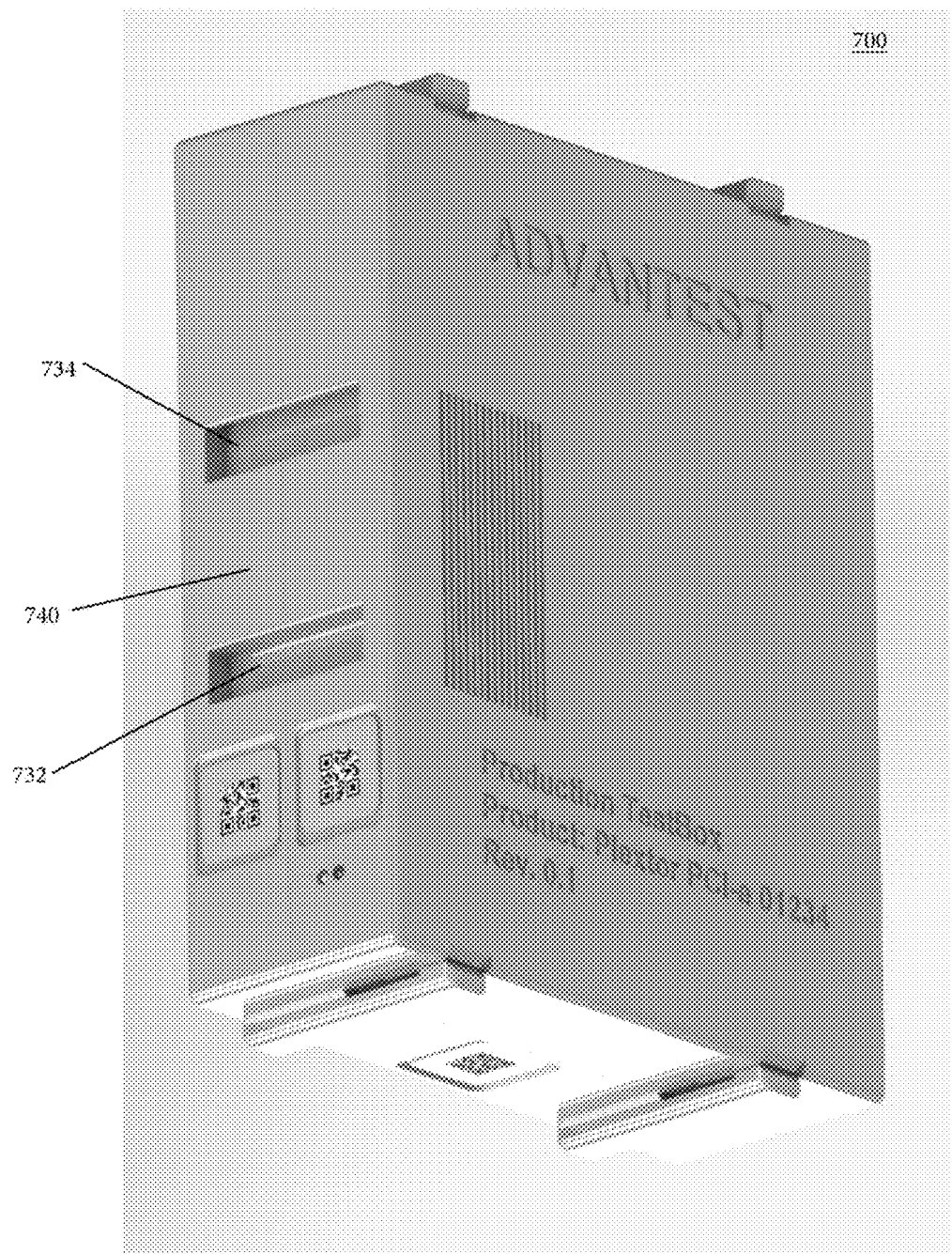
FIG. 8 illustrates a front perspective view of the DUT receptacle of FIG. 7 in accordance with an embodiment.
Figure 9:
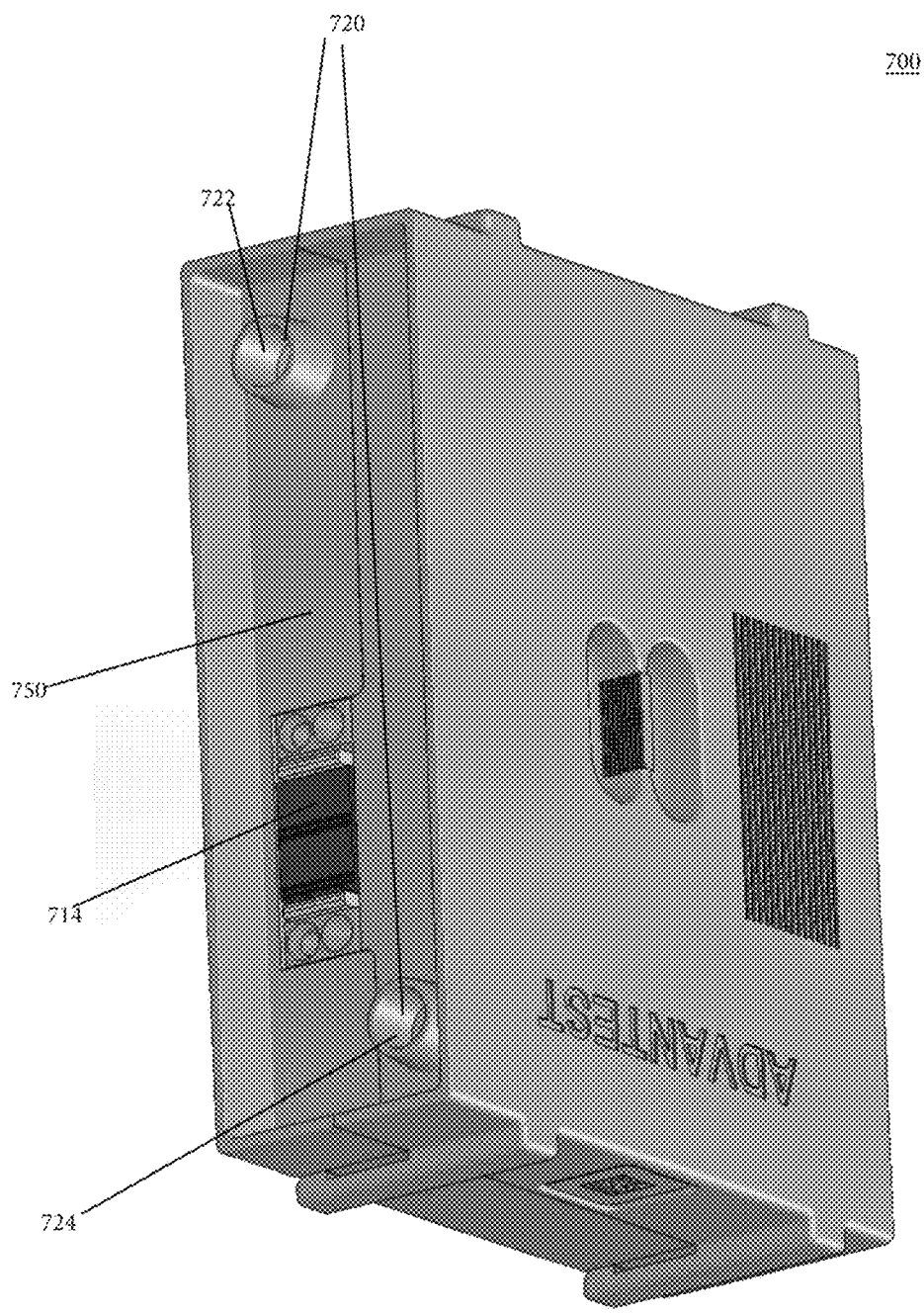
FIG. 9 illustrates a rear perspective view of the DUT receptacle of FIG. 7 in accordance with an embodiment.

Now, a brief description will be given of the DUT receptacle. FIG. 7 illustrates an exploded view of a DUT receptacle 700 in accordance with an embodiment, showing a DUT 800. FIG. 8 illustrates a front perspective view of the DUT receptacle 700 of FIG. 7 in accordance with an embodiment FIG. 9 illustrates a rear perspective view of the DUT receptacle 700 of FIG. 7 in accordance with an embodiment. It should be understood that the DUT receptacle 700 is not limited to the illustrations in FIGS. 7-9.

With reference to FIGS. 7-9, the DUT receptacle 700 provides a uniform size and shape and a uniform physical/air/electrical interface for a device under test (DUT) 800. There are may different types of devices (or DUTs) including, but not limited to, network cards, graphics cards, chips, microprocessors, hard disk drives (HDD), and solid state drives (SSD). Even within these exemplary device types, there are different device sub-types. As an example, a SSD with 500 GB storage capacity is a different type of device with respect to a SSD with 1 TB storage capacity. That is, the SSD with 1 TB storage capacity possesses features and characteristics that are different from the features and characteristics of the SSD with 500 GB storage capacity. Hence, the testing goals/requirements for the SSD with 1 TB storage capacity differ from the testing goals/requirements for the SSD with 500 GB storage capacity. Consequently, the SSD with 500 GB storage capacity is a different device type relative to the SSD with 1 TB storage capacity.

Moreover, there are numerous form factors and published specifications for devices to comply with to support compatibility and interoperability. Examples of form factors and published specifications include, but are not limited to, 3.5" HDD, 2.5" HDD, 2.5" SSD, 1.8" SSD, SATA, iSATA, PCIe, mPCIe, Fibre Channel, SAS, and USB. Rather than designing automated testing equipment (e.g., DUT (device under test) testing modules, testers, test floor equipment, and/or automated control) for a specific device type and/or a specific form factor and/or a specific published specification, the automated testing equipment (e.g., DUT testing modules, testers, test floor equipment, and/or automated control) is crafted for the uniform size and shape and the uniform physical/air/electrical interface offered by the DUT receptacle 700. Consequently, the automated testing equipment (e.g., DUT testing modules, testers, test floor equipment, and/or automated control) may be utilized with different types of devices (or DUTs) of different form factors and different published specifications.

Referring again to FIG. 7, the DUT receptacle 700 is configured to enclose and to hold inside a device under test (DUT) 800 in accordance with an embodiment. The interior of the DUT receptacle 700 may also be configured to enclose and hold inside a plurality of devices under test (DUTs) 800 in accordance with an embodiment. As shown in FIG. 7, the DUT receptacle 700 includes a base 704 to accommodate the DUT 800 and a lid 706 to securely couple to the base 704 in accordance with an embodiment. It should be understood that the DUT receptacle 700 may have any one of other configurations.

The DUT receptacle 700 also includes several other features. The DUT receptacle 700 includes an electrical interface 710 and an air flow interface 720. The electrical interface 710 includes a first connector 712 to couple to and to electrically communicate with the DUT 800 and a second connector 714 to couple to and to electrically communicate with automated testing equipment (e.g., DUT testing modules, testers, test floor equipment, and/or automated control). The air flow interface 720 includes a first air guide 722 to receive air flow from automated testing equipment (e.g., DUT testing modules, testers, test floor equipment, and/or automated control) and a second air guide 724 to output the air flow to automated testing equipment (e.g., DUT testing modules, testers, test floor equipment, and/or automated control). The air flow immerses the interior of the DUT receptacle 700 to maintain the interior of the DUT receptacle 700 at a controlled temperature, which is measured by a temperature sensor (not shown) inside the DUT receptacle 700 and reported to automated testing equipment (e.g., DUT testing modules, testers, test floor equipment, and/or automated control) via the electrical interface 710.

Now referring to FIG. 8, a front side 740 of the DUT receptacle 700 includes a first slot 732 and a second slot 734. The first slot 732 and the second slot 734 facilitate griping of the DUT receptacle 700 by automated testing equipment (e.g., testers and/or test floor equipment) for movement from one location to another location in accordance with an embodiment. It should be understood that the DUT receptacle 700 may be moved in any other manner.

With reference to FIG. 9, a rear side 750 of the DUT receptacle 700 includes the second connector 714 to couple to and to electrically communicate with automated testing equipment (e.g., DUT testing modules, testers, test floor equipment, and/or automated control) and the air flow interface 720, which has the first air guide 722 to receive air flow from automated testing equipment (e.g., DUT testing modules, testers, test floor equipment, and/or automated control) and the second air guide 724 to output the air flow to automated testing equipment (e.g., DUT testing modules, testers, test floor equipment, and/or automated control).

DUT Testing Module

Figure 10:
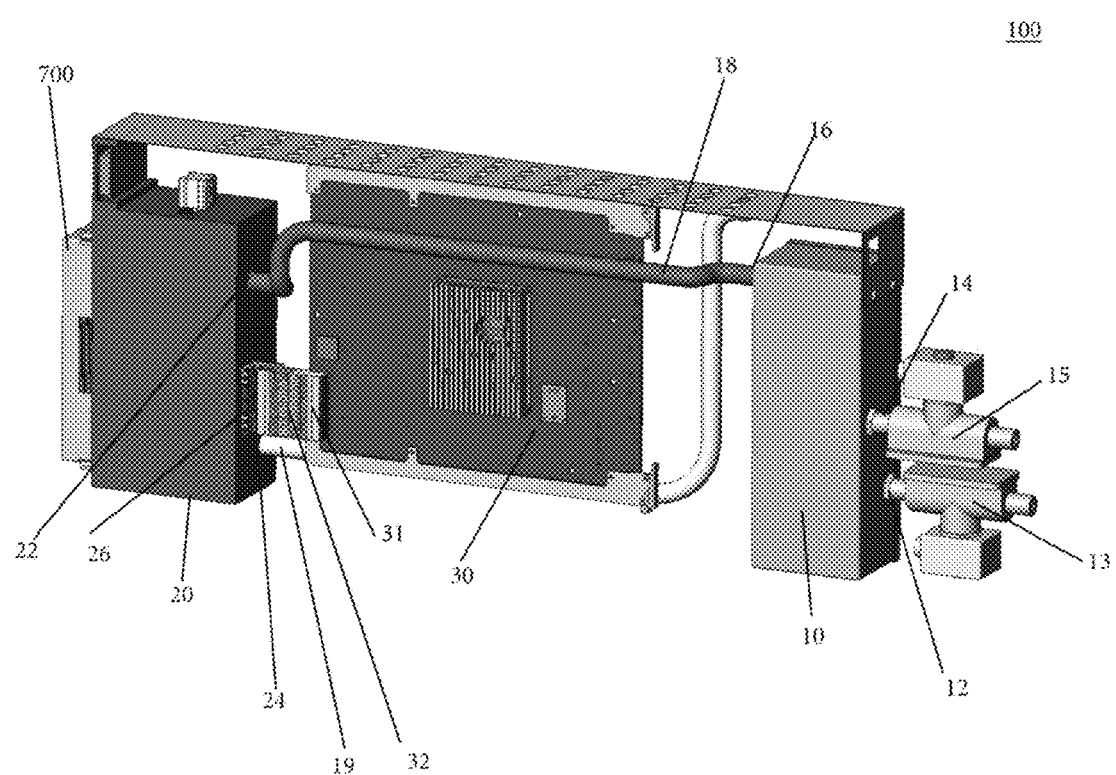
FIG. 10 depicts a side view of a DUT testing module in accordance with an embodiment, showing the DUT testing module without housing walls and showing a DUT receptacle inserted into the DUT testing module.
Figure 11:
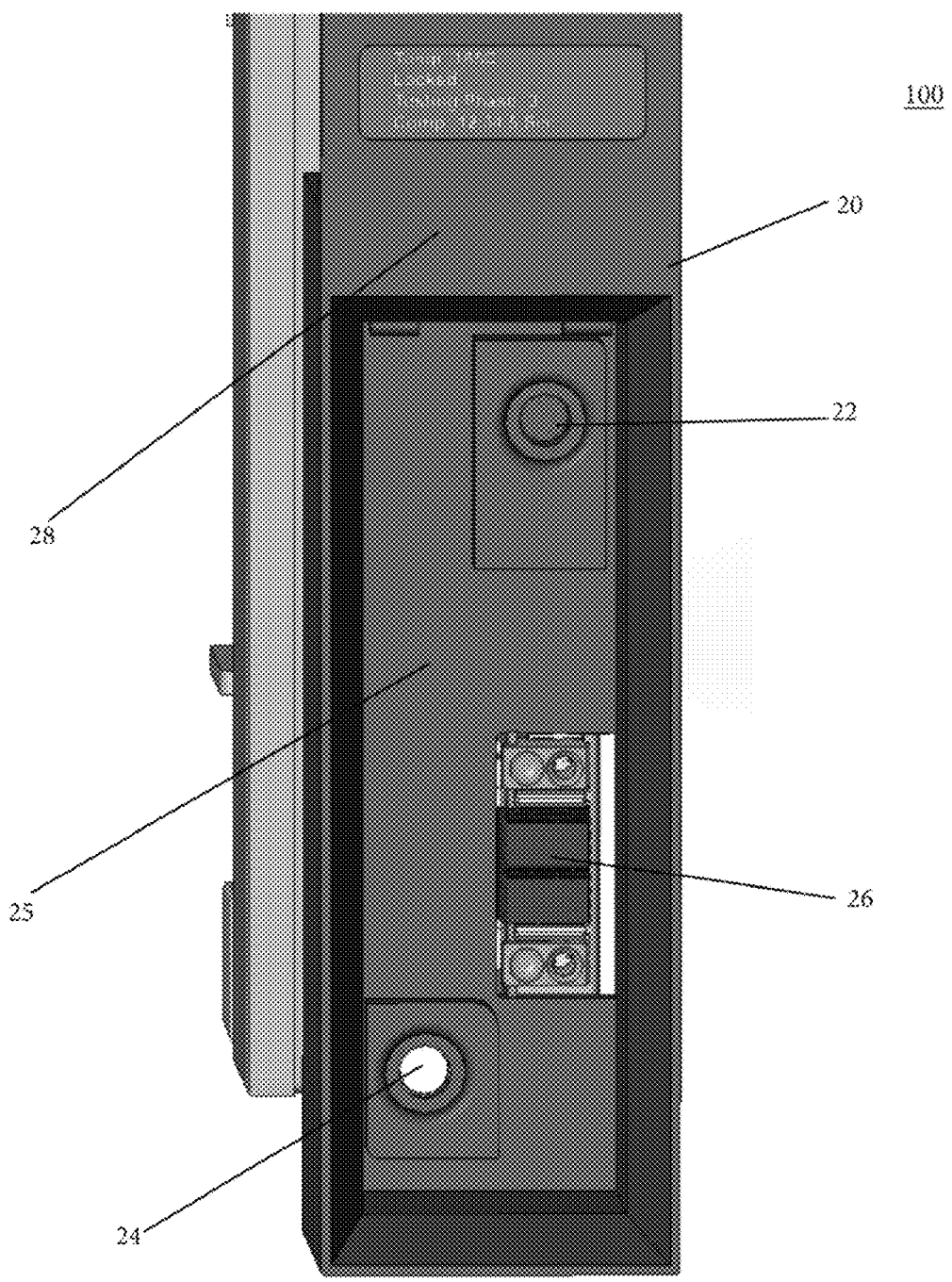
FIG. 11 shows a front view of the DUT testing module of FIG. 10 in accordance with an embodiment.
Figure 12:
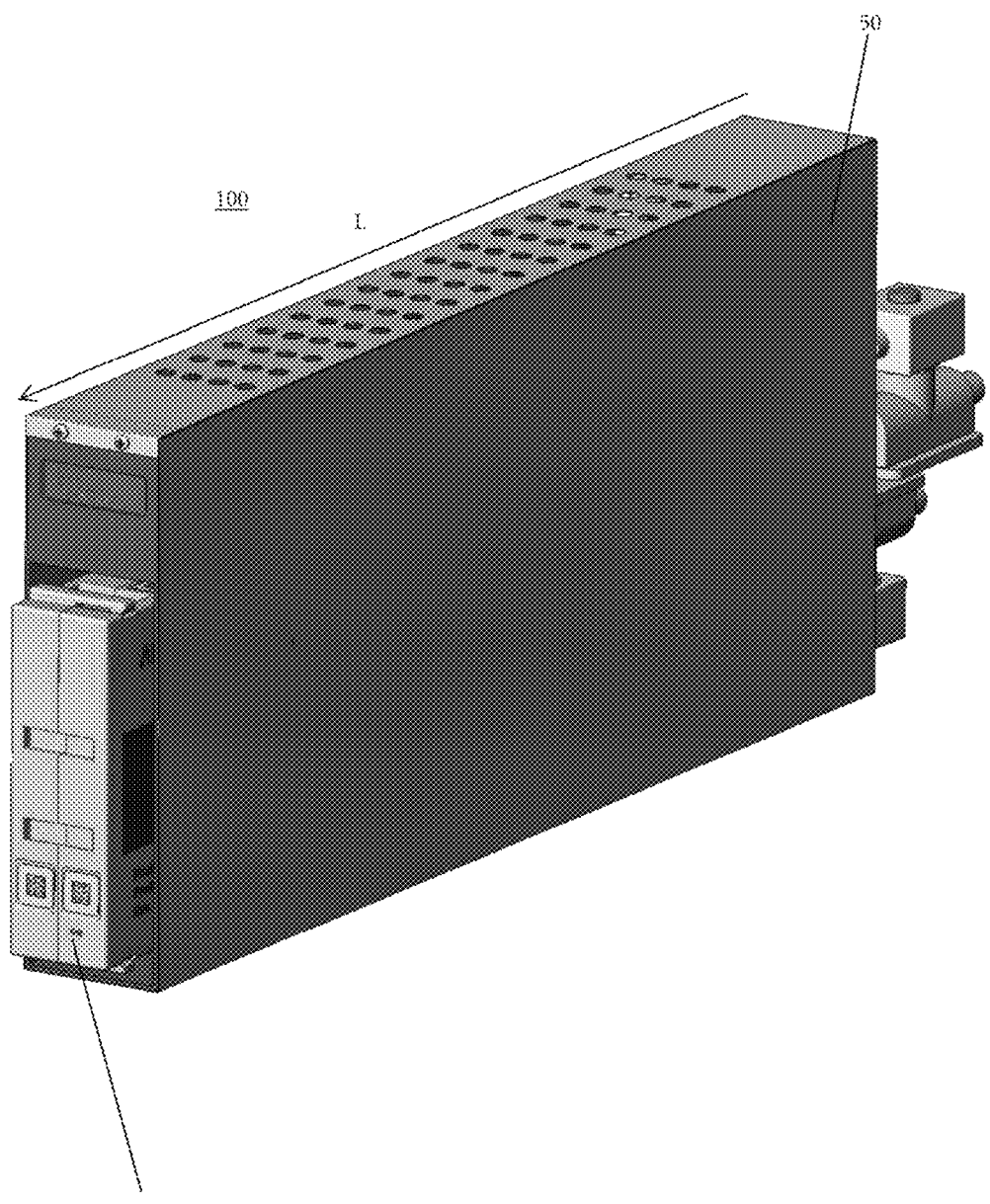
FIG. 12 illustrates a front perspective view of the DUT testing module of FIG. 10 in accordance with an embodiment, showing the DUT testing module with housing walls and showing a DUT receptacle inserted into the DUT testing module.

Now, a brief description will be given of the DUT testing module. FIG. 10 depicts a side view of a DUT testing module 100 in accordance with an embodiment, showing the DUT testing module 100 without housing walls and showing a DUT receptacle 700 inserted into the DUT testing module 100. FIG. 11 shows a front view of the DUT testing module 100 of FIG. 10 in accordance with an embodiment. FIG. 12 illustrates a front perspective view of the DUT testing module 100 of FIG. 10 in accordance with an embodiment, showing the DUT testing module 100 with housing walls and showing a DUT receptacle 700 inserted into the DUT testing module 100. It should be understood that the DUT testing module 100 is not limited to the illustrations in FIGS. 10-12.

FIG. 10 depicts a side view of a DUT (device under test) testing module 100 in accordance with an embodiment, showing the DUT testing module 100 without housing walls and showing a DUT receptacle 700 inserted into the DUT testing module 100.

As shown in FIG. 10, the DUT testing module 100 accepts the DUT receptacle 700 to establish an individualized automated testing environment. The DUT 800 (FIG. 7) inside the DUT receptacle 700 will be subjected to testing administered by the DUT testing module 100. The DUT testing module 100, the DUT receptacle 700, and the DUT 800 (FIG. 7) inside the DUT receptacle 700 are part of an individualized automated testing environment that is independent of any other DUT testing module, any other DUT receptacle, and/or any other DUT.

To support and operate in the individualized automated testing environment, the DUT testing module 100 includes an air mixing chamber 10, a docking unit 20, and a DUT test execution unit 30.

The air mixing chamber 10 outputs a mixed air flow to deliver to the interior of the DUT receptacle 700 via hose 18 while the DUT receptacle 700 permits interior air to exit via hose 19 to an external environment to ventilate or to travel to an air recycling mechanism. The mixed air flow is temperature controlled. For proper testing of the DUT 800 (FIG. 7) inside the DUT receptacle 700, test conditions may include a specific temperature or a range of temperatures to subject the DUT 800 before testing, during testing, and/or after testing. The DUT receptacle 700 includes a temperature sensor (not shown) in the interior of the DUT receptacle 700. The temperature sensor communicates with and reports measured temperature to the DUT testing module 100. Consequently, the interior temperature of the DUT receptacle 700 may be at a controlled temperature for testing by delivering the mixed air flow to the interior of the DUT receptacle 700 via hose 18 and by using the measured temperature from the temperature sensor (not shown) located in the interior of the DUT receptacle 700.

Continuing, the air mixing chamber 10 includes a first air inlet 12, a second air inlet 14, and an air outlet 16. The first air inlet 12 is operable to receive a first air flow. The second air inlet 14 is operable to receive a second air flow. The air outlet 16 is operable to output the mixed air flow via hose 18. A first valve 13 is coupled to the first air inlet 12. A second valve 15 is coupled to the second air inlet 14. Further, the first air flow is a high temperature air flow through the first air inlet 12. In an embodiment, the first air flow is at a temperature of 85° C. The second air flow is a low temperature air flow through the second air inlet 14. In an embodiment, the second air flow is at a temperature of −10° C.

In operation, the manipulation (e.g., via pneumatic control, via electronic control, or via any other manner) of the first valve 13 and the second valve 15 sends high temperature air flow and low temperature air flow into the air mixing chamber 10. Inside the air mixing chamber 10, the high temperature air flow and low temperature air flow mix together to stabilize at a controlled temperature. The controlled temperature may be adjusted by moving the first valve 13 and/or the second valve 15 towards either an opened position or a closed position. The controlled temperature may be ramp up or down or may be kept stable.

Focus is now on the docking unit 20 of the DUT testing module 100. The individualized automated testing environment is established by inserting the DUT receptacle 700 into the docking unit 20. In FIG. 11 (which shows a front view of the DUT testing module 100 of FIG. 10 in accordance with an embodiment), features of the docking unit 20 of the DUT testing module 100 are depicted. The front side 28 of the DUT testing module 100 and the docking unit 20 are illustrated in FIG. 11.

With respect to FIG. 11, the docking unit 20 includes a cavity 25, a first air opening 22, a second air opening 24, and an electrical connector 26. The cavity 25 receives and securely holds the DUT receptacle 700. Also, the cavity 25 eases and guides the DUT receptacle 700 during its insertion into the cavity 25. In an embodiment, the docking unit 20 is comprised of a plastic material (e.g., acetal homopolymer). The first air opening 22 is coupled to hose 18, which delivers the mixed air flow from the air mixing chamber 10 to the interior of the DUT receptacle 700. Moreover, the second air opening 24 is coupled to hose 19, which carries interior air from the DUT receptacle 700 to an external environment to ventilate or to an air recycling mechanism. Further, the electrical connector 26 permits electrical communication between the DUT receptacle 700 and the DUT testing module 100.

Referring still to FIG. 11, the rear side 750 (FIG. 9) of the DUT receptacle 700 is inserted into the cavity 25 of the docking unit 20. The shape of the cavity 25 is designed to accept the uniform size and shape and the uniform physical/air/electrical interface offered by the DUT receptacle 700, facilitating insertion of the DUT receptacle 700 by an automated mechanism (e.g., a gripper) into the cavity 25 irrespective of the device type, size, and form factor of the DUT 800 (FIG. 7) inside the DUT receptacle 700. The rear side 750 (FIG. 9) of the DUT receptacle 700 is sufficiently inserted to enable the second connector 714 (FIG. 9) of the DUT receptacle 700 to mate with the electrical connector 26 of the docking unit 20, to enable the first air guide 722 (FIG. 9) of the DUT receptacle 700 to mate with the first air opening 22 of the docking unit 20, and to enable the second air guide 724 (FIG. 9) of the DUT receptacle 700 to mate with the second air opening 24 of the docking unit 20.

Returning to FIG. 10, the DUT testing module 100 includes a DUT test execution unit 30 and an intermediate connector 32 in accordance with an embodiment. The DUT test execution unit 30 includes a connector 31. The connector 31 is coupled to the intermediate connector 32, which is coupled to the connector 26 of the docking unit 20. The intermediate connector 32 protects the connector 31 from the wear and tear over time associated with insertion and removal of the DUT receptacle 700 with respect to the cavity 25, avoiding the need to replace the DUT test execution unit 30 due to damage to the connector 31. In an embodiment, the intermediate connector 32 and the connector 26 are easily replaceable. In an alternate embodiment, the connector 31 directly connects with the connector 26 of the docking unit 20.

Operating in the individualized automated testing environment established by the DUT testing module 100 and the DUT receptacle 700, the DUT test execution unit 30 is operable to perform a test on the DUT 800 (FIG. 7) that is inside of the DUT receptacle 700. The DUT test execution unit 30 further includes electronic components to enable the DUT test execution unit 30 to set-up, start, monitor, log, and end a test for the DUT 800 (FIG. 7) that is inside of the DUT receptacle 700. In an embodiment, the test is custom selected based on identification information of the DUT 800 (FIG. 7). For example, if the identification information of the DUT 800 (FIG. 7) designates the DUT 800 (FIG. 7) as being a SSD with 500 GB storage capacity and a specific set of features, a customized test for the SSD with 500 GB storage capacity and the specific set of features will be selected. Further, if the identification information of the DUT 800 (FIG. 7) designates the DUT 800 (FIG. 7) as being a SSD with 1 TB storage capacity and a specific group of features, a customized test for the SSD with 1 TB storage capacity and the specific group of features will be selected.

In an embodiment, the DUT test execution unit 30 electronically communicates through the connector 31, the connector 32, and the connector 26, which is coupled to the second connector 714 (FIG. 9) of the DUT receptacle 700, i) to send test inputs, test commands, and/or any other input information to or ii) to receive test outputs, test responses, and/or any other output information from the DUT 800 (FIG. 7) inside the DUT receptacle 700. The second connector 714 (FIGS. 7 and 9) of the DUT receptacle 700 electrically communicates with the electrical interface 710 (FIG. 7) of the DUT receptacle 700, which electrically communicates with the DUT 800 (FIG. 7) via the first connector 712 (FIG. 7).

Further, the DUT test execution unit 30 ensures the air mixing chamber 10 furnishes the controlled temperature to the DUT receptacle 700 to comply with the test conditions of the test performed on the DUT 800 (FIG. 7) that is inside of the DUT receptacle 700. Moreover, via the connector 31, the connector 32, and the connector 26, which is coupled to the second connector 714 (FIG. 9) of the DUT receptacle 700, the DUT test execution unit 30 receives the measured temperature from the temperature sensor (not shown) located in the interior of the DUT receptacle 700 and makes appropriate adjustments to the controlled temperature to comply with the test conditions of the test performed on the DUT 800 (FIG. 7) that is inside of the DUT receptacle 700.

There are many different types of tests which the DUT 800 (FIG. 7) that is inside of the DUT receptacle 700 may be subjected. The different types of tests include, but not limited to, functionality tests, reliability tests, and stress tests. There are also different types of tests that may be variations of or subtypes of the functionality tests, reliability tests, and stress tests. The goal of a functionality test is to determine whether the DUT 800 (FIG. 7) operates as it is designed to operate. This may include characterizing a plurality of properties, such as clock speed, power usage, response time, etc. The aim of a reliability test is to determine how aging, temperature, and other factors affect the useful lifetime of the DUT 800 (FIG. 7). Accelerated aging of the DUT 800 (FIG. 7) may be achieved by operating the DUT 800 (FIG. 7) in a high temperature environment for an extended period of time. This is also referred to as a burn-in test. Further, the objective of a stress test is to uncover the impact of extreme conditions, such as unusual cold temperature, unusual hot temperature, high voltages, high currents, and etc., on the DUT 800 (FIG. 7). For example, military and heavy industrial environments regularly experience extreme conditions.

In an embodiment, the DUT testing module 100 is configurable by exchanging its DUT test execution unit 30 for another DUT test execution unit 30. As discussed above, there are many different types of tests which the DUT 800 (FIG. 7) that is inside of the DUT receptacle 700 may be subjected. To perform a functionality test, the DUT test execution unit 30 is designed with a wide variety of features and high performance electronics, which are more than sufficient to also perform a reliability test or a stress test. This design is a high cost design. However, to perform either a reliability test or a stress test, a limited set of features and modest performance electronics are sufficient to enable the DUT test execution unit 30 to perform the test task, reducing costs. Accordingly, there may be variations of the DUT testing module 100. In an embodiment, the DUT test execution unit 30 with the wide variety of features and high performance electronics is selected and incorporated into a DUT testing module 100 focused on performing the functionality test while the DUT test execution unit 30 with the limited set of features and modest performance electronics is selected and incorporated into a DUT testing module 100 focused on performing either the reliability test or the stress test.

FIG. 12 illustrates a front perspective view of the DUT testing module 100 of FIG. 10 in accordance with an embodiment, showing the DUT testing module 100 with housing walls and showing a DUT receptacle 700 inserted into the DUT testing module 100. As depicted in FIG. 12, the DUT testing module 100 includes a housing 50 that at least partially encloses the air mixing chamber 10, the docking unit 20, and the DUT test execution unit 30. Moreover, the DUT testing module 100 has a length L. In an embodiment, the housing 50 is comprised of steel sheet metal.

Tester

Now, detailed description of a tester will be provided. The tester along with DUT testing modules, test floor equipment, and automated control implement the individualized automated testing environment of the new paradigm for automated device testing.

Figure 1:
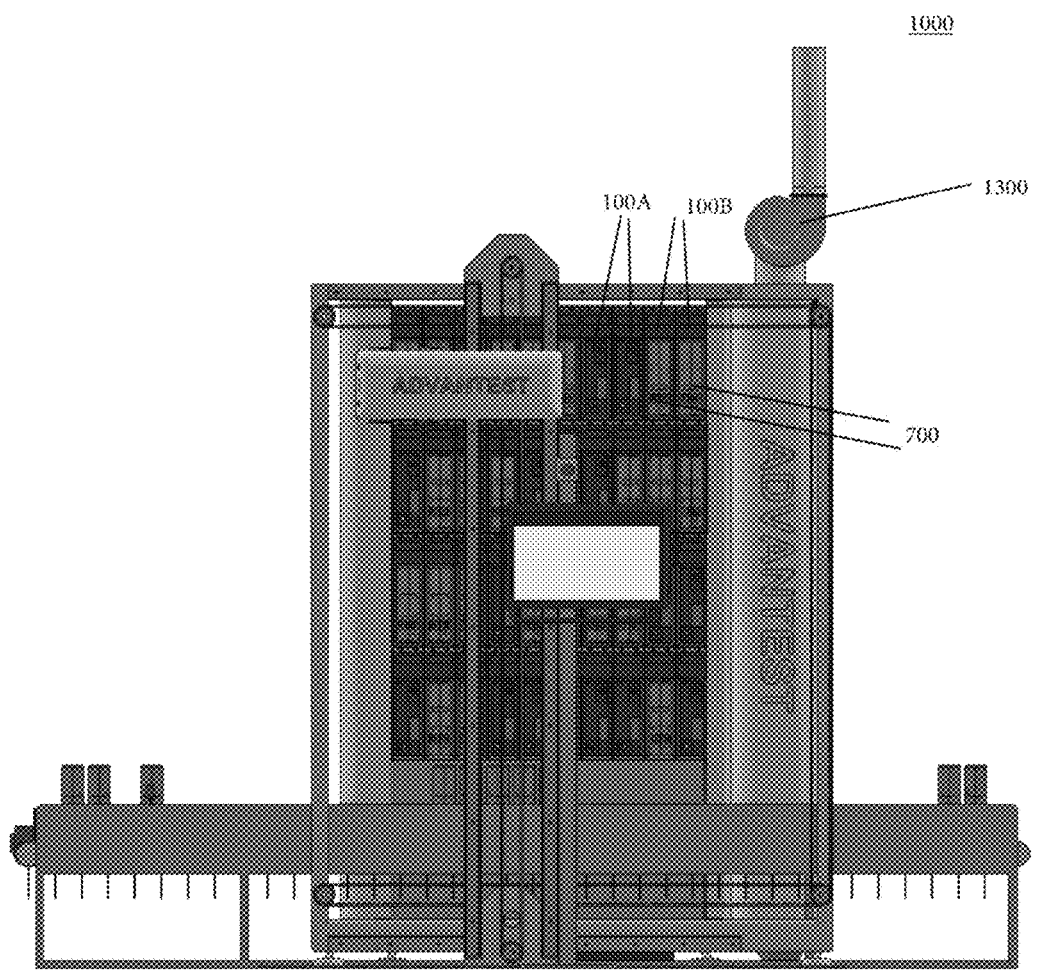
FIG. 1 illustrates a front side of a tester in accordance with an embodiment, showing DUT (device under test) testing modules and DUT receptacles.

With the housing 50 installed, the DUT testing module 100 may be operated as an exchangeable or replaceable module of a tester 1000 as depicted in FIG. 1. Specifically, FIG. 1 illustrates a front side of a tester 1000 in accordance with an embodiment, showing DUT testing modules 100A and 100B and DUT receptacles 700. As shown in FIG. 1, the tester 1000 includes a plurality of DUT testing modules 100A and 100B. The description of the DUT testing module 100 is equally applicable to DUT testing modules 100A and 100B. DUT receptacles 700 are inserted in the DUT testing modules 100B but not in the DUT testing modules 100A on the front side of the tester 1000. It should be understood that the tester 1000 is not limited to the illustration of FIG. 1.

Figure 5:
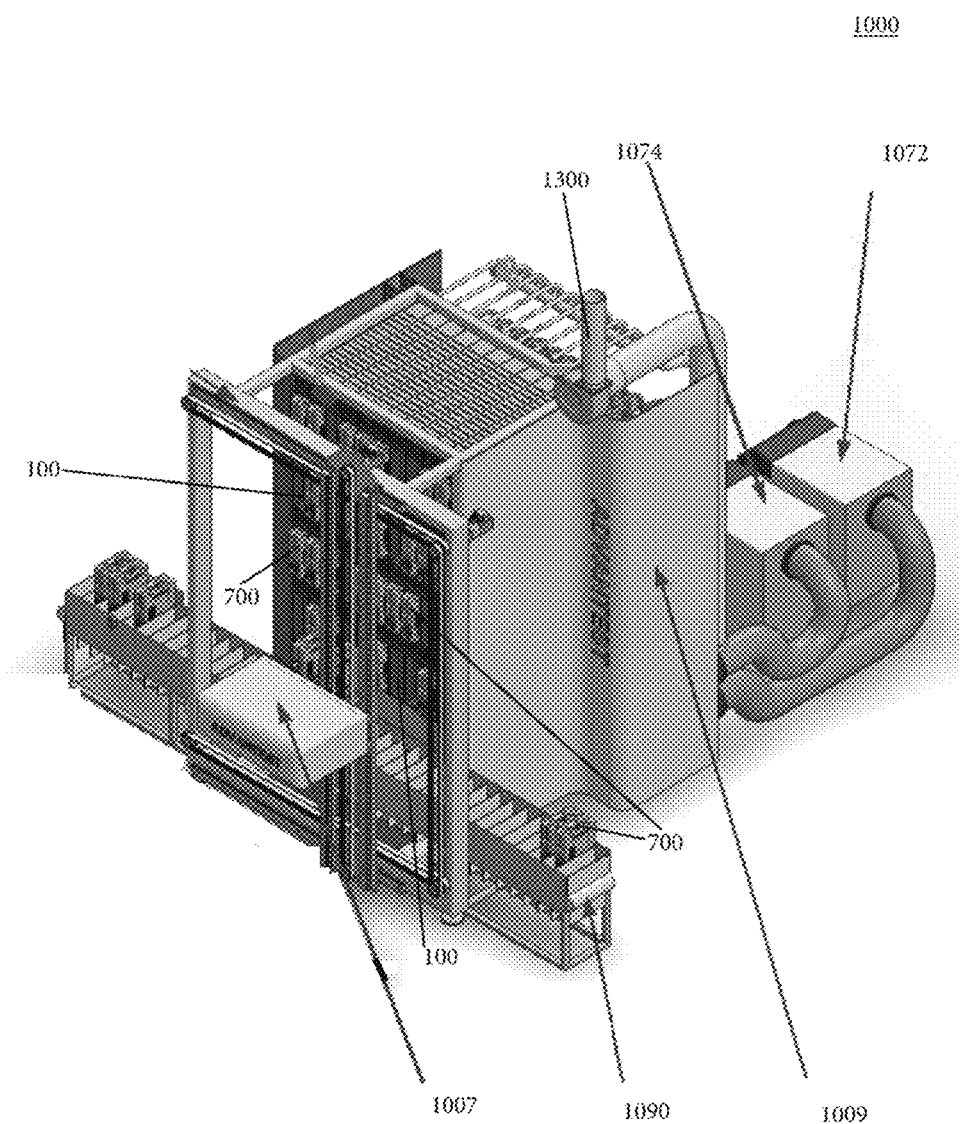
FIG. 5 depicts a front perspective view of the tester of FIG. 1 in accordance with an embodiment, showing DUT testing modules and DUT receptacles.

Continuing with FIG. 1, the tester 1000 offers numerous features for operating the individualized automated testing environments established by the DUT testing modules 100A and 100B in combination with the DUT receptacles 700. The tester 1000 is configured to supply power to the DUT testing modules 100A and 100B and the DUT receptacles 700 via DUT testing modules 100A and 100B. Additionally, the tester 1000 includes a high temperature air source 1072 (FIG. 5) and a low temperature air source 1074 (FIG. 5). The high temperature air source 1072 (FIG. 5) may be coupled to the first valve 13 (FIG. 10), which is coupled to the first air inlet 12 (FIG. 10) of DUT testing modules 100 (FIG. 10), 100A, and 100B. The first air inlet 12 is operable to receive the high temperature air flow. In an embodiment, the high temperature air flow is at a temperature of 85° C. The low temperature air source 1074 (FIG. 5) may be coupled to the second valve 15 (FIG. 10), which is coupled to the second air inlet 14 (FIG. 10). The second air inlet 14 is operable to receive the low temperature air flow. In an embodiment, the low temperature air flow is at a temperature of −10° C.

Further, the tester 1000 has a negative pressure blower 1300. In operation, the negative pressure blower 1300 forces or directs the interior air from the DUT receptacles 700 to an external environment to ventilate or to an air recycling mechanism. The interior air from the DUT receptacles 700 travels via the hose 19 (FIG. 10) coupled to the second air opening 24 (FIG. 10) of the DUT testing modules 100 (FIG. 10), 100A, and 100B.

In sum, the tester 1000 is a self-contained unit. Moreover, the tester 1000 facilitates simultaneous operation of individualized automated testing environments (established by the DUT testing modules 100A and 100B in combination with the DUT receptacles 700) which may involve different types of DUTs 800 (FIG. 7) undergoing different types of tests and/or progressing at different stages of testing while the DUTs 800 (FIG. 7) are at different controlled temperatures within the interior of the DUT receptacles 700.

Figure 2:
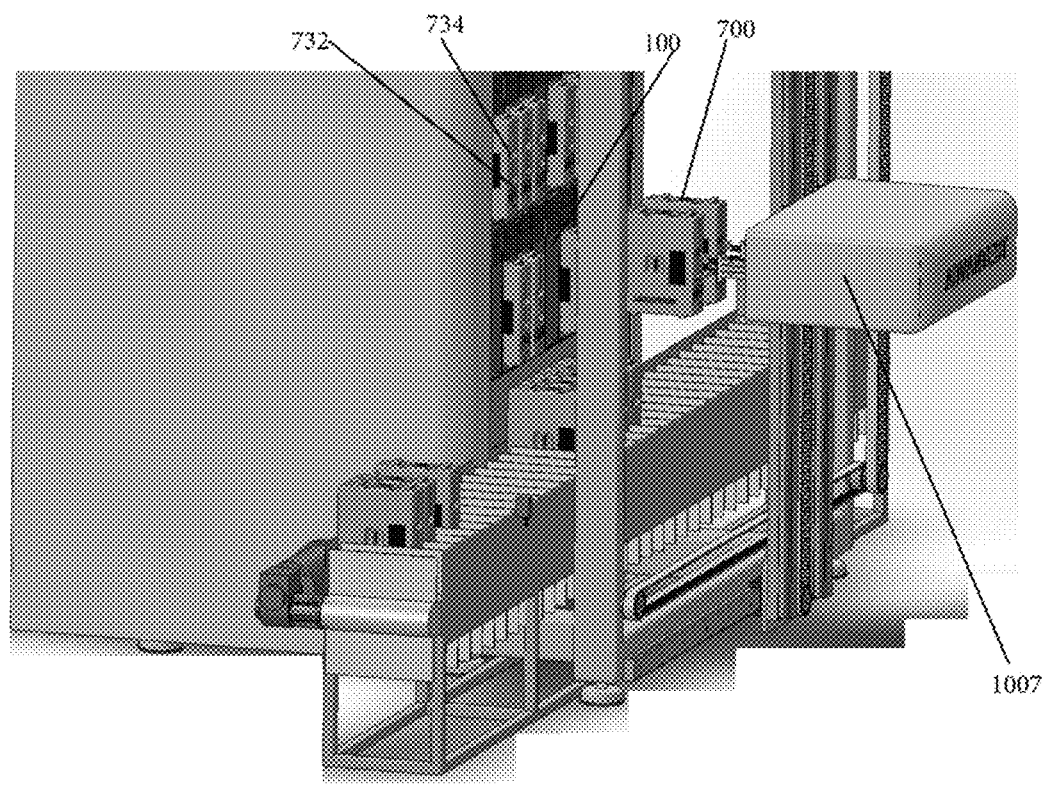
FIG. 2 illustrates an automated gripper of the tester of FIG. 1 in accordance with an embodiment.

FIG. 2 illustrates an automated gripper 1007 of the tester 1000 of FIG. 1 in accordance with an embodiment. It should be understood that the automated gripper 1007 is not limited to the illustrations of FIGS. 2 and 5.

The automated gripper 1007 is configured to insert the DUT receptacle 700 into and to remove the DUT receptacle 700 from the DUT testing module 100 of the tester 1000 in an automated manner. In an embodiment, the automated gripper 1007 uses the first slot 732 and the second slot 734 of the DUT receptacle 700 to securely grip the DUT receptacle 700. It should be understood that any other type of DUT receptacle handling mechanism may be used.

Figure 3:
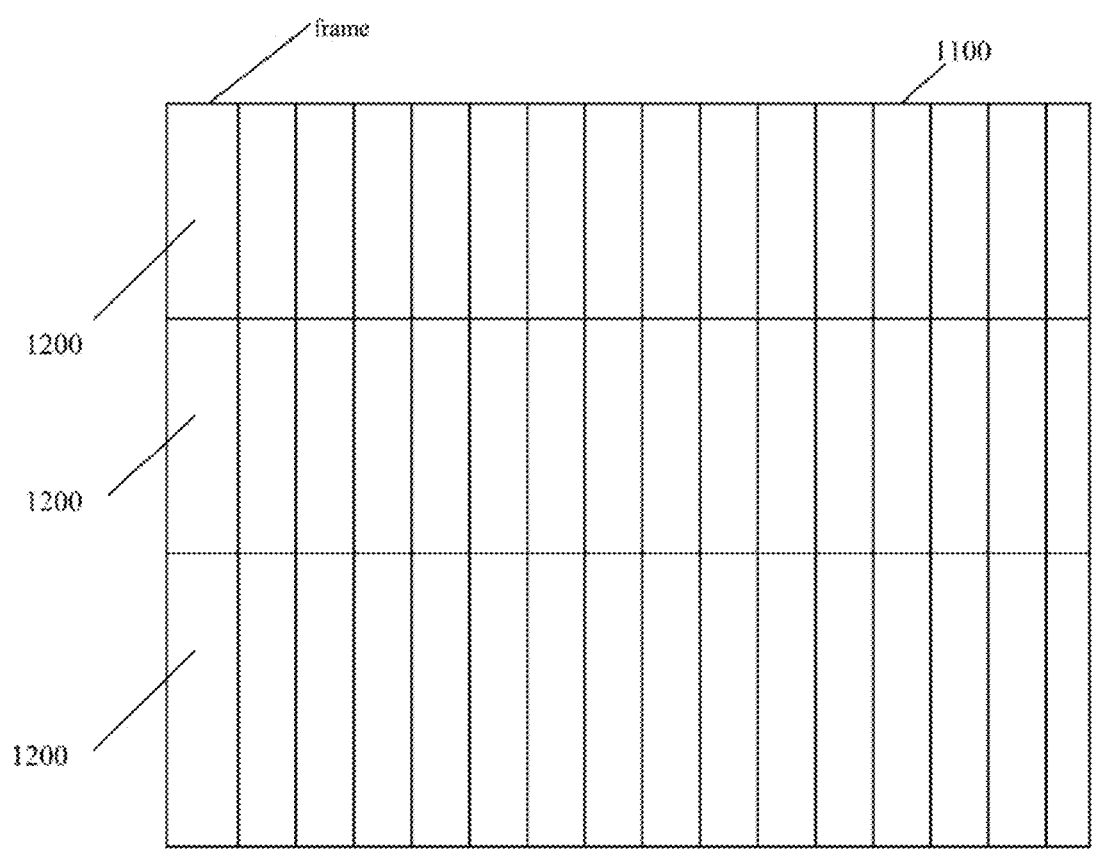
FIG. 3 illustrates a front side of a frame of the tester of FIG. 1 in accordance with an embodiment.

Referring now to FIG. 3, a front side of a frame 1100 of the tester 1000 of FIG. 1 is illustrated in accordance with an embodiment. The length from the front side of the frame 1100 of the tester 1000 (FIG. 1) to the rear side (not shown) is sufficient to accommodate the length L (FIG. 12) of the DUT testing module 100. The front side of the frame 1100 of the tester 1000 (FIG. 1) includes a plurality of apertures 1200 that extend to the rear side (not shown) to accommodate the length L (FIG. 12) of the DUT testing module 100. In an embodiment, the plurality of apertures 1200 are sized to permit the DUT testing module 100 with the housing 50 (FIG. 12) to be inserted into and removed from the apertures 1200 as an exchangeable or replaceable module. In an embodiment, the DUT testing module 100 with the housing 50 (FIG. 12) is insertable and removable from the rear side (not shown) of the frame 1100 of the tester 1000 (FIG. 1). The DUT testing module 100 may be secured to the frame 1100 of the tester 1000 (FIG. 1) by bolts or by any other manner.

Figure 4:
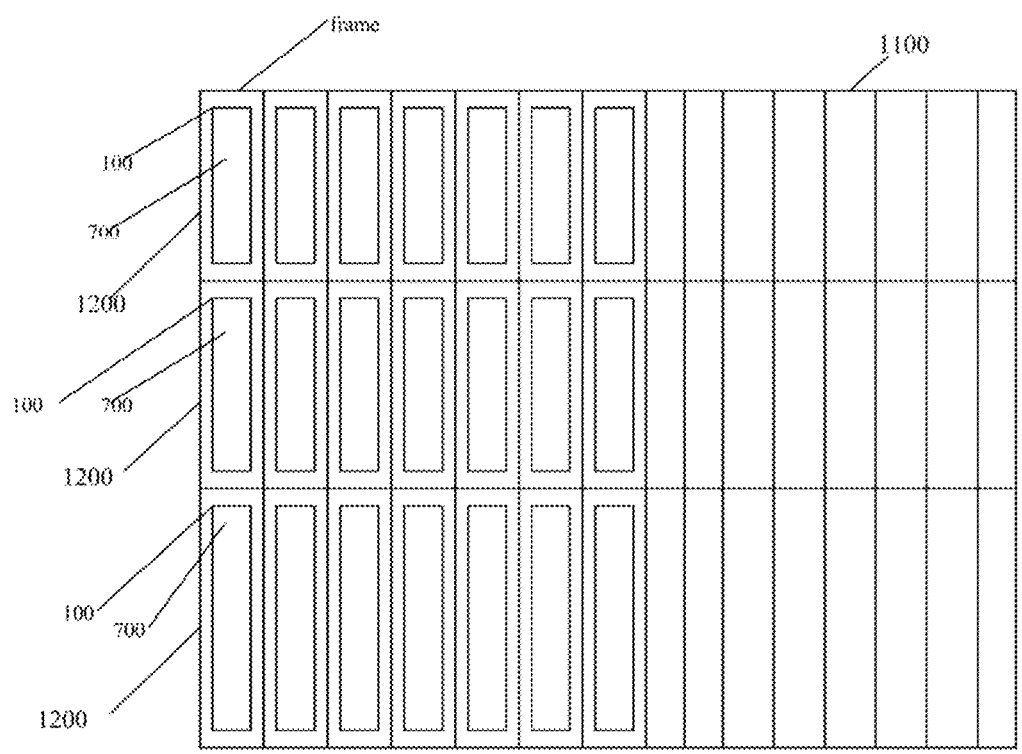
FIG. 4 illustrates DUT testing modules installed in the frame of FIG. 3 in accordance with an embodiment.

FIG. 4 illustrates DUT testing modules 100 installed in the frame 1100 (FIG. 3) of the tester 1000 (FIG. 1) in accordance with an embodiment. The DUT testing modules 100 with their housing 50 (FIG. 12) are installed in the apertures 1200 of the frame 1100 of the tester 1000 (FIG. 1). DUT receptacles 700 may be inserted in the DUT testing modules 100. The DUT testing modules 100 operate independently of each other. As a result, one or more of the DUT testing modules 100 may be uninstalled/removed from the frame 1100 of the tester 1000 (FIG. 1) for maintenance without interfering with the operation of the rest of the DUT testing modules 100. Moreover, a DUT testing module 100 focused on performing the functionality test may be exchanged for a DUT testing module 100 focused on performing either the reliability test or the stress test, or vice versa. In effect, the DUT testing modules 100 installed in the frame 1100 of the tester 1000 (FIG. 1) form a matrix or test wall.

Continuing with FIG. 4, the DUT testing modules 100 installed in the frame 1100 (FIG. 3) of the tester 1000 (FIG. 1) may include DUT testing modules 100 focused on performing the functionality test and DUT testing modules 100 focused on performing either the reliability test or the stress test. As a consequence, different types of tests may be performed with the tester 1000 (FIG. 1) by moving the DUT receptacle 700 from one DUT testing module 100 to another DUT testing module 100 within the same tester 1000 (FIG. 1). After completing a first type of test (e.g., functionality test) on the DUT 800 (FIG. 7) that is inside the DUT receptacle 700 by using a first DUT testing module 100 focused on performing the functionality test, a second type of test (e.g., reliability test) may be performed on the DUT 800 (FIG. 7) by moving the DUT receptacle 700 to a second DUT testing module 100 focused on performing the reliability test. This avoids the expense of having different types of testers and the waste of time due to moving a DUT 800 (FIG. 7) to the different physical locations of different types of testers.

FIG. 5 depicts a front perspective view of the tester 1000 of FIG. 1 in accordance with an embodiment, showing DUT testing modules 100 and DUT receptacles 700. The tester 1000 further includes a low temperature air source 1074, a high temperature air source 1072, an indexing conveyor 1090 to move DUT receptacles 700 toward and away from the tester 1000, and a shield 1009.

Figure 6:
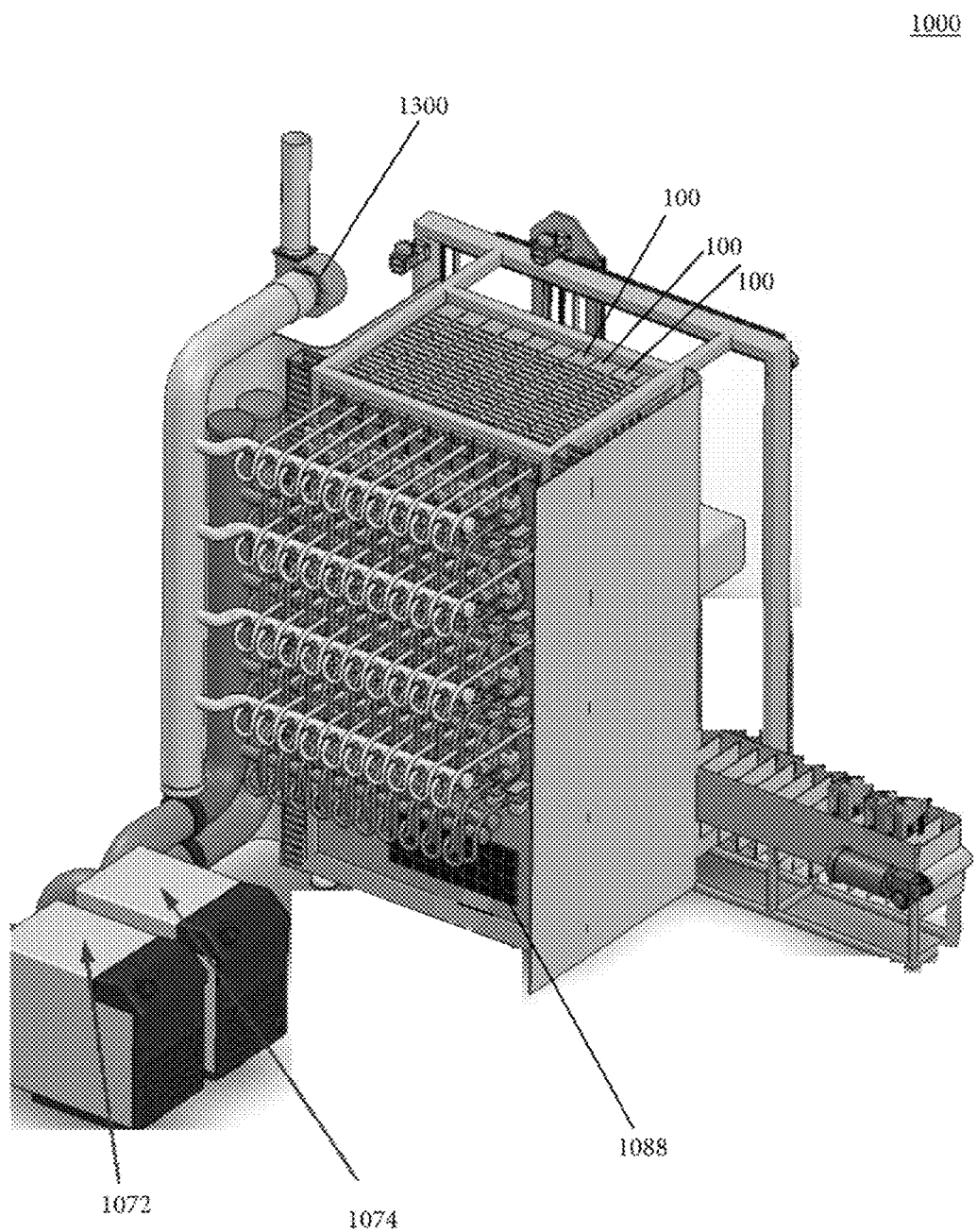
FIG. 6 illustrates a rear perspective view of the tester of FIG. 1 in accordance with an embodiment, showing DUT testing modules.

FIG. 6 illustrates a rear perspective view of the tester 1000 of FIG. 1 in accordance with an embodiment, showing DUT testing modules 100. In an embodiment, the tester 1000 includes temperature controllers 1088 to assist the DUT testing modules 100 to perform a test at a controlled temperature on the DUT 800 (FIG. 7) that is inside of the DUT receptacle 700 (FIG. 1). That is, the interior temperature of DUT receptacle 700 (FIG. 1) is at a controlled temperature before, during, and/or after the test according to the test condition requirements of the test. Additionally, the low temperature air source 1074, the high temperature air source 1072, and the negative pressure blower 1300 of the tester 1000 are depicted.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A testing system, comprising:
a frame including at least one aperture extending from a front side of the frame to a rear side of the frame;
a DUT (device under test) testing module inserted into the at least one aperture, wherein the DUT testing module includes a plurality of air hoses and is operable to receive and hold a DUT receptacle including an electrical interface, an air flow interface, and a DUT coupled to the electrical interface, wherein the DUT receptacle is configured to enclose and hold inside the DUT, wherein the DUT testing module is operable to couple to and to use the electrical interface and the air flow interface to perform a test at a controlled temperature on the DUT that is inside of the DUT receptacle; and
a blower positioned externally relative to the DUT testing module and configured to move an air flow through and out of the DUT testing module and the DUT receptacle via the air hoses.

2. The testing system of claim 1, further comprising a DUT receptacle handling mechanism to insert the DUT receptacle into and to remove the DUT receptacle from the DUT testing module in an automated manner.

3. The testing system of claim 1, further comprising a high temperature air source.

4. The testing system of claim 3, further comprising a low temperature air source.

5. The testing system of claim 4, wherein the DUT testing module further includes a first valve configured to couple to the high temperature air source.

6. The testing system of claim 5, wherein the DUT testing module further includes a second valve configured to couple to the a low temperature air.

7. The testing system of claim 1, wherein the DUT comprises one of a plurality of different device types.

8. The testing system of claim 7, wherein the plurality of different device types includes a solid state drive having a first storage capacity.

9. The testing system of claim 1, wherein the DUT testing module is operable to use the electrical interface to send input information to and to receive output information from the DUT.

10. A testing system, comprising:
a frame including a plurality of apertures, wherein the apertures extend from a front side of the frame to a rear side of the frame;
a first DUT (device under test) testing module inserted into a first aperture of the plurality of apertures, wherein the first DUT testing module includes a plurality of first air hoses and is operable to receive and hold a first DUT receptacle including a first electrical interface, a first air flow interface, and a first DUT coupled to the first electrical interface, wherein the first DUT receptacle is operable to enclose and hold inside the first DUT, wherein the first DUT testing module is operable to couple to and to use the first electrical interface and the first air flow interface to perform a first type of test at a first controlled temperature on the first DUT that is inside of the first DUT receptacle;
a second DUT testing module inserted into a second aperture of the plurality of apertures, wherein the second DUT testing module includes a plurality of second air hoses and is operable to receive and hold a second DUT receptacle including a second electrical interface, a second air flow interface, and a second DUT coupled to the second electrical interface, wherein the second DUT receptacle is operable to enclose and hold inside the second DUT, wherein the second DUT testing module is operable to couple to and to use the second electrical interface and the second air flow interface to perform a second type of test at a second controlled temperature on the second DUT that is inside of the second DUT receptacle; and
a blower positioned externally relative to the first and second DUT testing modules and configured to move a first air flow through and out of the first DUT testing module and the first DUT receptacle via the first air hoses and configured to move a second air flow through and out of the second DUT testing module and the second DUT receptacle via the second air hoses,
wherein size, shape, first electrical interface, and first air flow interface of the first DUT receptacle is uniform with size, shape, second electrical interface, and second air flow interface of the second DUT receptacle.

11. The testing system of claim 10, further comprising a DUT receptacle handling mechanism to insert the DUT receptacles into and to remove the DUT receptacles from the DUT testing modules in an automated manner.

12. The testing system of claim 10, further comprising a high temperature air source.

13. The testing system of claim 12, further comprising a cold temperature air source.

14. The testing system of claim 10, wherein the first DUT comprises one of a plurality of different device types, and wherein the second DUT comprises one of the plurality of different device types.

15. The testing system of claim 14, wherein the plurality of different device types includes a first solid state drive having a first storage capacity and a second solid state drive having a second storage capacity.

16. The testing system of claim 10, wherein the first DUT testing module is operable to use the first electrical interface to send first input information to and to receive first output information from the first DUT, and wherein the second DUT testing module is operable to use the second electrical interface to send second input information to and to receive second output information from the second DUT.

17. A method, comprising:
coupling a DUT (device under test) receptacle to a first DUT testing module, wherein the first DUT testing module includes a plurality of first air hoses and is located in a first aperture of a frame of a tester, wherein the first aperture extends from a front side of the frame to a rear side of the frame, wherein the DUT receptacle includes an electrical interface, an air flow interface, and a DUT coupled to the electrical interface, and wherein the DUT receptacle is operable to enclose and hold inside the DUT;

performing a first type of test at a first controlled temperature on the DUT that is inside of the DUT receptacle by using the first DUT testing module, wherein the first DUT testing module is operable to couple to and to use the electrical interface and the air flow interface to perform the first type of test, wherein said performing a first type of test comprises moving a first air flow through and out of the first DUT testing module and the DUT receptacle via the first air hoses by using a blower of the tester;

after the first type of test is performed, coupling the DUT receptacle to a second DUT testing module, wherein the second DUT testing module is located in a second aperture of the frame of the tester, wherein the second aperture extends from the front side of the frame to the rear side of the frame; and performing a second type of test at a second controlled temperature on the DUT that is inside of the DUT receptacle by using the second DUT testing module, wherein the second DUT testing module includes a plurality of second air hoses and is operable to couple to and to use the electrical interface and the air flow interface to perform the second type of test, wherein said performing a second type of test comprises moving a second air flow through and out of the second DUT testing module and the DUT receptacle via the second air hoses by using the blower, which is positioned externally relative to the first and second DUT testing modules.

18. The method of claim 17, wherein the DUT comprises one of a plurality of different device types, wherein the plurality of different device types includes a first solid state drive having a first storage capacity and a second solid state drive having a second storage capacity.

19. The method of claim 17, wherein the first type of test comprises a functionality test, and wherein the second type of test comprises a burn-in test.

20. The method of claim 17, wherein the first DUT testing module is operable to use the electrical interface to send first input information to and to receive first output information from the DUT, and wherein the second DUT testing module is operable to use the electrical interface to send second input information to and to receive second output information from the DUT.

* * * * *